Figure 1:
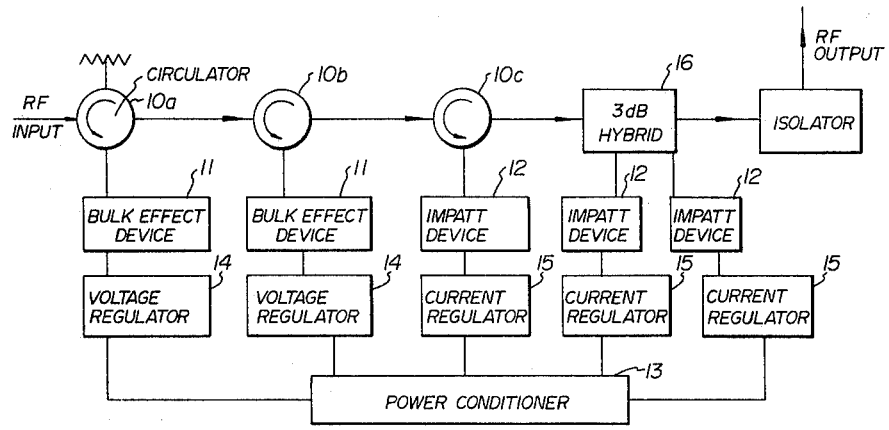

United States Patent [19]

Nigrin

[11] 4,086,543
[45] Apr. 25, 1978

[54] TRAVELLING WAVE HYBRID JUNCTION AMPLIFIER

[75] Inventor: Jan Nigrin, Edmonton, Canada

[73] Assignee: Canadian Patents & Development Limited, Ottawa, Canada

[21] Appl. No.: 707,199

[22] Filed: Jul. 21, 1976

[51] Int. Cl.² ............................................. H03F 3/60
[52] U.S. Cl. ...................................... 330/287; 330/53; 333/11
[58] Field of Search ...................... 333/11; 330/53, 287

[56] References Cited

U.S. PATENT DOCUMENTS

| | | | |
|---|---|---|---|
| 3,451,005 | 6/1969 | Skullestad | 330/53 |
| 3,628,167 | 12/1971 | Hines | 330/53 |
| 3,646,467 | 2/1972 | Smith | 330/287 |
| 3,755,753 | 8/1973 | Smith | 330/287 |
| 3,784,925 | 1/1974 | Chang et al. | 330/53 |
| 3,952,262 | 4/1976 | Jamison | 330/53 |
| 4,025,872 | 5/1977 | Grayzel | 330/53 |

*Primary Examiner*—Saxfield Chatmon, Jr.
*Attorney, Agent, or Firm*—James R. Hughes

[57] ABSTRACT

The basic module of a microwave Travelling-Wave Hybrid Junction amplifier (TWHJ) consists of a hybrid junction (0°, 180° or 90° hybrid) combined with an appropriate phase-shifting element ($\pi/2$ element is needed for 0° and 180° hybrids and no element is needed for a 90° hybrid) and three negative conductance circuits terminating three ports of the modified hybrid while the fourth port serves as an input-output port. Because of proper stabilization and matching, the negative conductance circuits are not oscillating but are acting as reflection type amplifiers. Any RF energy applied to the input port of the hybrid is multiply reflected while travelling through the hybrid giving rise to amplified RF energy emerging from the input port of the hybrid junction. Under ideal conditions, the power amplification of the TWHJ amplifier is the product of the power amplifications of individual negative conductance circuits and the saturated output power of the amplifier is equal to the saturated output powers of the circuits adjacent to the output port. The TWHJ amplifier can be extended in a modular fashion to any number of negative conductance elements to achieve the desired power amplification and saturated output power.

5 Claims, 7 Drawing Figures

TRAVELLING WAVE HYBRID JUNCTION AMPLIFIER

This invention relates to travelling wave power amplification circuits, and more particularly, to a travelling wave configuration which utilizes hybrid junctions and negative conductance elements, both solid-state and vacuum tube type. In practice, the invention is most advantageous for solid-state devices.

Microwave tubes, e.g. travelling wave tubes (TWT's) and klystrons, are still in great use in the microwave amplifiers for medium and high power levels at frequencies above 5 GHz. Recently, solid-state negative conductance devices, e.g. Bulk Effect and Impatt devices, capable of generating a few watts power levels above 5 GHz have been developed. The latest trend in the microwave industry, however, has been the use of these devices as amplifiers. Recent results have shown the feasibility of replacing TWT's in both narrow band medium power amplifier applications and for lower power octave bandwidth above 5 GHz. Depending upon the bandwidth and RF power levels, the gain of reflection type amplifiers using a single solid-state devices varies between 4.0 – 15.0 dB, but 8.0 – 10.0 dB gains are most typical. To achieve power gains of TWT's, single device amplifier stages are cascaded into solid state chains.

It is an object of this invention to provide a new travelling-wave type power amplification circuit which provides power gain equal to the product of two and any high number of power gains of one stage negative conductance amplifiers.

It is another object of this invention to provide a new travelling-wave type power amplification circuit which provides saturated output power equal to the sum of two and any higher even number of saturated output power of one stage negative conductance amplifiers.

It is another object of this invention to provide a new travelling-wave type power amplification circuit which utilizes some one stage negative conductance amplifiers many times thus increasing the amplifier overall dc to RF efficiency.

It is another object of this invention to provide a new travelling-wave type power amplification circuit which significantly reduces the number of active and passive components as well as interconnections thus increasing the reliability of operation and reducing the production cost.

Figure 2:
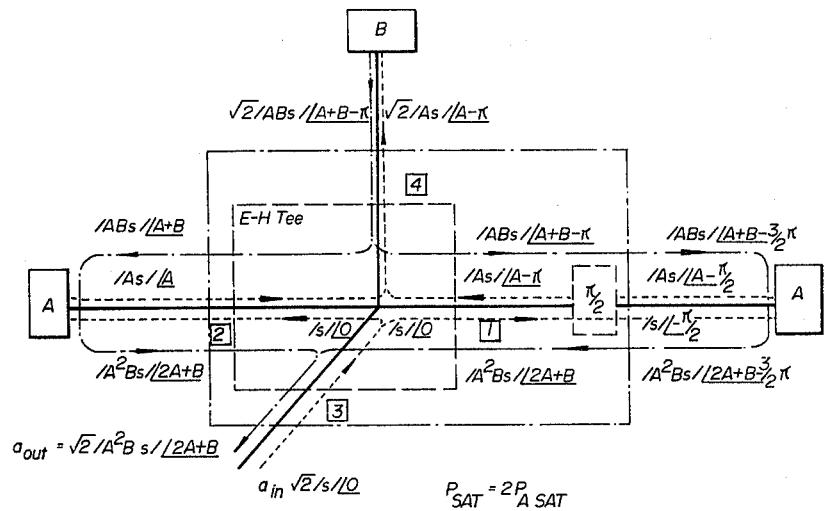
Figure 3:
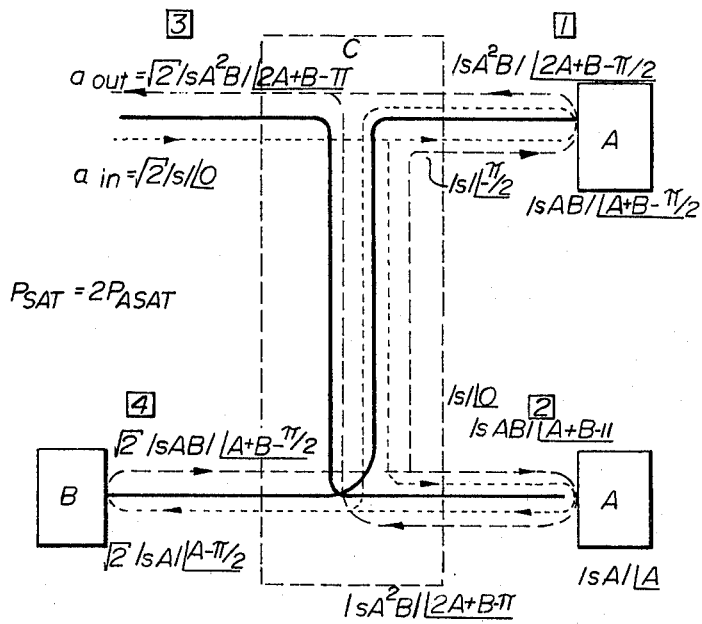
Figure 4:
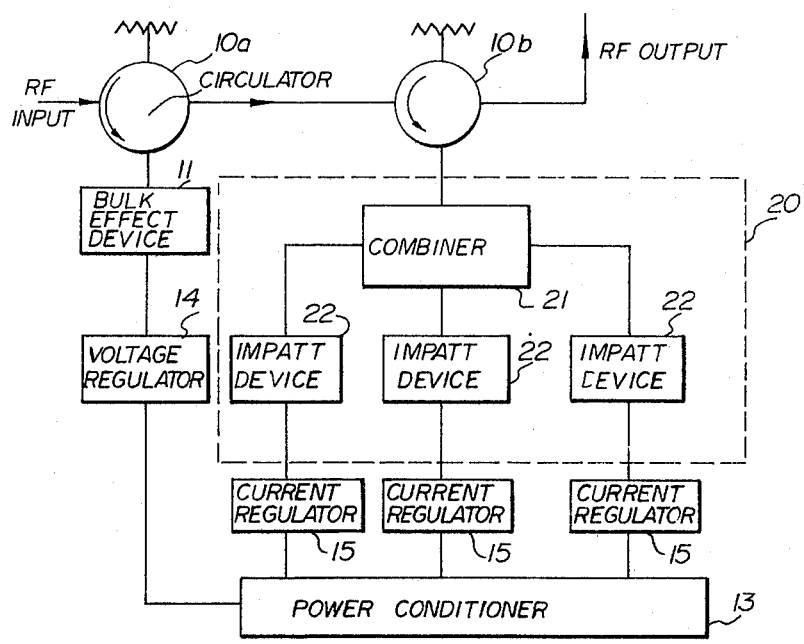
Figure 5:
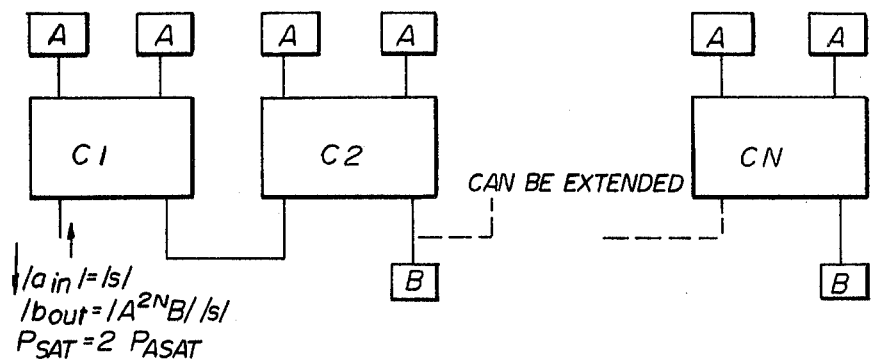
Figure 6:
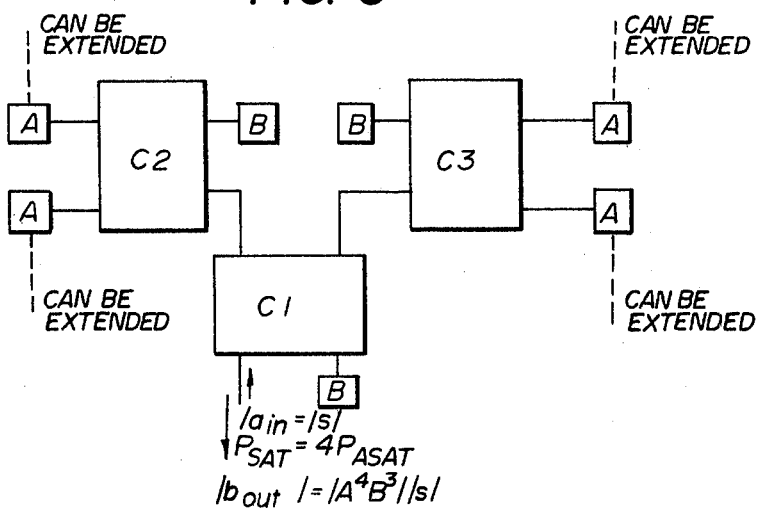
Figure 7:
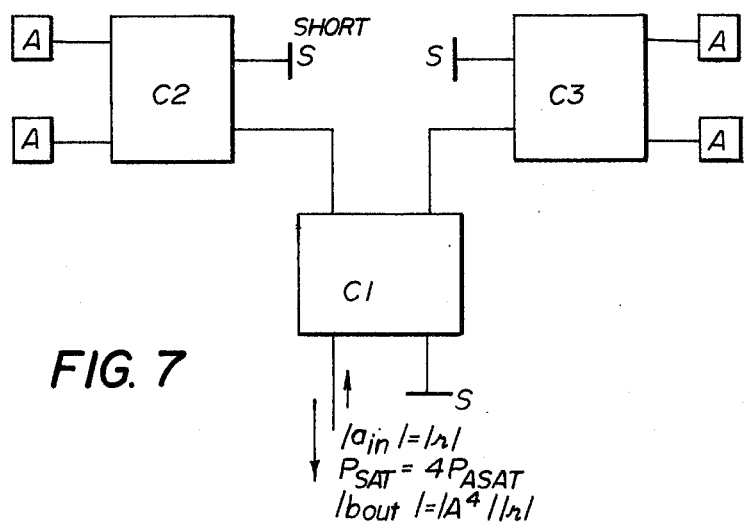

In drawings which illustrate an embodiment of the invention,

FIG. 1 is a block diagram of a microwave solid-state amplifier of the prior art, FIG. 2 is a schematic drawing of the basic unit of the travelling wave hybrid junction amplifier using a waveguide magic tee (180° hybrid) in accordance with the present invention, FIG. 3 is a schematic drawing of the basic unit of the travelling wave hybrid junction amplifier using a 90° hybrid junction in accordance with the present invention, FIG. 4 is a block diagram of the microwave solid-state amplifier in accordance with the present invention, FIG. 5 is a schematic drawing of the travelling wave hybrid junction amplifier cascade for higher power gains in accordance with the present invention, FIG. 6 is a schematic drawing of the travelling-wave hybrid junction amplifier cascade for higher power gains and saturated output power in accordance with the present invention, FIG. 7 is a schematic drawing of the travelling-wave hybrid junction amplifier cascade for higher saturated output power in accordance with the present invention.

A typical solid-state medium power amplifier is shown in FIG. 1. A series of circulators $10a$, $10b$, $10c$ in cascade receive power from Bulk Effect devices 11 and Impatt devices 12 such as to amplify an input RF signal. These devices are controlled by a power conditioner 13 and voltage regulators 14 and current regulators 15 as appropriate. The output stage of the amplifier chain is handled with a balanced amplifier configuration using a 3 dB hybrid 16 to produce output powers in the multiple watt range. Since waveguides have to be used at higher frequencies, the solid-state amplifier chains are bulky and because of the large number of interconnections required, the solid-state reliability may not be achieved.

The principles of operation of the basic unit of the TWHJ amplifier are described using FIG. 2. Assuming that an input power wave $$a_{in} = a_3 = \sqrt{2}\,|s|\,\angle 0$$

is entering the amplifier via arm 3 of the ideal magic tee 16 described by the following scattering matric:

$$S_{180} = \frac{1}{\sqrt{2}} \begin{vmatrix} 0 & 0 & 1 & 1 \\ 0 & 0 & 1 & -1 \\ 1 & 1 & 0 & 0 \\ 1 & -1 & 0 & 0 \end{vmatrix}$$

The waves $$b_{11} = b_{21} = |s|\,\angle 0$$

are emerging from the arms 1 and 2 while no wave is directly excited in the 4 arm. In the above, the first subscript refers to the port and the second one denotes the number of the wave. The $b_{11}$ wave is then delayed by $(\pi/2)$ in delay device (phase shifter) 17 and both waves undergo reflection $$\Gamma = \frac{Z_A - Z_O}{Z_A + Z_O} = |A|\,\angle A$$

in the terminating active devices "A". In the above, $Z_o$ is the characteristic impedance of the transmission lines forming the arms of the hybrid and $Z_A$ is the active device impedance appropriately transformed to device terminals so that the real parts of the impedances satisfy $$|Re(Z_A)| < Re(Z_O)$$

Thus the active devices do not oscillate, they merely reflect any incident waves with amplified amplitude. The waves which are entering the hybrid via the 1 and 2 arms are then given by $$a_{11} = a_{21}\angle(-\pi) = /As/\,\angle(A-\pi)$$

Because of proper phase relationship, the above waves are destructively interfering in the 3 arm while exciting the wave $$B_{41} = \sqrt{2}\,|As|\,\angle(A-\pi)$$

in the 4 arm. The $b_{41}$ wave is reflected by the "B" active device resulting in $$a_{41} = \sqrt{2}\,|Abs|\underline{/(A+B-\pi)}$$

This wave is divided between the 1 and 2 arms resulting in $$b_{12} = b_{22}\angle(\pi) = |ABs|\,\angle(A+B-\pi)$$

The $b_{12}$ wave is again delayed by $(\pi/2)$ and both waves are once more reflected by the A active devices resulting in the waves $$a_{12} = a_{22} = |A^2Bs|\underline{/(2A+B)}$$

which are entering the hybrid for the last time. Because of the proper amplitude and phase relationship, the above waves are destructively interfering in the 4 arm and are forming the following wave $$b_3 = \sqrt{2}\,|A^2Bs|\,\underline{/(2A+B)}$$

which is emerging from the input port of the amplifier. Thus, while travelling through the amplifier, the incident power wave is appropriately split, phased combined and multiple reflected by the active devices. The power gain of the basic unit, which is given by $$|G_p| = \left|\frac{b_3}{a_3}\right|^2 = |A^2B|^2$$

is equal to the product of the power gains of individual active devices while the saturated output power of the basic unit is equal to the sum of the saturated output power of the active devices in the arms 1 and 2, i.e. twice that of the active device A.

The FIG. 2 device described above is in relation to a 0° or 180° hybrid junction. FIG. 3 illustrates a TWHT amplifier using a 90° hybrid in which case no phase shifter is required. A similar action is obtained with the following scattering matrix applying:

$$S_{90°} = \frac{1}{\sqrt{2}}\begin{vmatrix} 0 & 0 & 1 & -j \\ 0 & 0 & -j & 1 \\ 1 & -j & 0 & 0 \\ -j & 1 & 0 & 0 \end{vmatrix}$$

In applications where only the saturated output power over wider frequency range is of major concern, the active device B can be substituted by a passive termination characterized by $|B| < 1$; e.g. a short circuit with B=1. Then not only the saturated output power but also the dB power gain of the amplifier using a short circuit is doubled in comparison with that of single device A.

Calculations show that the power gain of THWJ amplifier using a realistic waveguide magic tee decreases with increasing VSWR of the tee, e.g. the gain of ab ideal 30 dB amplifier is reduced by about 5 dB if a hybrid with VSWR $\leq$ 1.05 is used. In deal TWHJ amplifiers any port of the hybrid can equally well serve as an input-output port. The calculations, however, clearly indicate that the port containing a plane of symmetry should be selected as the input port of realistic THWJ amplifiers, e.g. E and H ports of the waveguide magic tee are the preferred ports. Calculations also show that TWHJ amplifier may become unstable depending on the degree of imbalance and the placement of the A active devices. In poorly matched hybrids, the isolation between the 1 and 2 as well as 3 and 4 arms is significantly reduced and, if high gain stages are employed, the TWHJ amplifier may become unstable.

Because both active devices in the TWHJ amplifier output stage, i.e. the A devices, multiplicatively increase the power gain of the chain as shown in FIG. 4, one stage of the conventional amplifier chain shown in FIG. 1 comprising an active device and circulator, as well as the output isolator are not needed to achieve similar power gain and saturated output power when replaced with the TWHJ amplifier 20 made up of combiner (magic tee) and three Impatt Devices 22 (acting as devices "A" and "B". The complexity of the amplifier RF circuitry is thus reduced and the overall dc to RF efficiency of the amplifier is also improved.

Using the proposed travelling-wave principle many combinations of the appropriately modified hybrids, active devices and proper passive terminations can be designed to achieve the desired power gain and saturated output power. Three possible combinations of devices "A", "B", and combiners C1, C2, . . . CN are shown in FIGS. 5, 6, and 7.

I claim:

1. A microwave travelling wave hybrid junction amplifier comprising:
    (a) a microwave hybrid junction having four ports one of which acts as an input-output port for the amplifier,
    (b) negative conductance elements acting as reflection type amplifiers connected to and terminating the other three ports such that RF energy applied to the input-output port is multiply reflected and amplified while passing through the hybrid by the negative conductance elements to emerge as amplified RF energy from the input output port.

2. A microwave travelling wave hybrid junction amplifier as in claim 1 wherein the junction is a 0° hybrid and $\pi/2$ phase shifting element is positioned in one of the arms of the hybrid such as to provide proper phase relationships.

3. A microwave travelling wave hybrid junction amplifier as in claim 1 wherein the junction is a 180° hybrid and $\pi/2$ phase shifting element is positioned in one of the arms of the hybrid such as to provide proper phase relationships.

4. A microwave travelling wave hybrid junction amplifier as in claim 1, wherein the negative conductance element is a one-port solid-state device.

5. A microwave travelling wave hybrid junction amplifier as in claim 1, wherein the negative conductance element is a a one-port vacuum tube device.

* * * * *